(12) United States Patent
Joyce et al.

(10) Patent No.: US 9,995,769 B2
(45) Date of Patent: Jun. 12, 2018

(54) UNIVERSAL WATTHOUR METER SOCKET/ADAPTER FOR FIELD TESTING

(71) Applicant: RADIAN RESEARCH, INC., Lafayette, IN (US)

(72) Inventors: Joseph P. Joyce, Lafayette, IN (US); Robert L. Kindschi, Lafayette, IN (US)

(73) Assignee: RADIAN RESEARCH, INC., Lafayette, IN (US)

( * ) Notice: Subject to any disclaimer, the term of this patent is extended or adjusted under 35 U.S.C. 154(b) by 779 days.

(21) Appl. No.: 14/387,065

(22) PCT Filed: Mar. 15, 2013

(86) PCT No.: PCT/US2013/032267
§ 371 (c)(1),
(2) Date: Sep. 22, 2014

(87) PCT Pub. No.: WO2013/148336
PCT Pub. Date: Oct. 3, 2013

(65) Prior Publication Data
US 2015/0048857 A1 Feb. 19, 2015

Related U.S. Application Data

(60) Provisional application No. 61/616,781, filed on Mar. 28, 2012.

(51) Int. Cl.
*G01R 1/04* (2006.01)
*G01R 11/04* (2006.01)
(Continued)

(52) U.S. Cl.
CPC ....... *G01R 1/0466* (2013.01); *G01R 1/06788* (2013.01); *G01R 11/04* (2013.01); *G01R 31/00* (2013.01); *G01R 35/04* (2013.01)

(58) Field of Classification Search
CPC .. G01R 21/133; G01R 21/127; G01R 21/008; G01R 21/06; G01R 11/25
(Continued)

(56) References Cited

U.S. PATENT DOCUMENTS 5,248,935 A * 9/1993 Sakoyama ............... G06G 7/02
324/103 R
6,015,314 A 1/2000 Benfante
(Continued)

OTHER PUBLICATIONS

PCT Search Report and Written Opinion for PCT/US2013/032267, completed Jun. 6, 2013.

*Primary Examiner* — Melissa Koval
*Assistant Examiner* — Trung Nguyen
(74) *Attorney, Agent, or Firm* — Barnes & Thornburg LLP

(57) ABSTRACT

A portable device for field testing watthour meters including a socket with one or more connectors configured to engage a watthour meter blade is disclosed. The connectors may include a pair of wire forms so oriented that the connector can connect to a watthour meter blade oriented in either of two orientations 90° apart from each other by resiliently deflecting portions of the wire forms. The connectors may include a jaw socket cup, a torsion clip in the jaw socket cup for contacting a watthour meter blade when the watthour meter blade is inserted into the jaw socket cup. The torsion clip includes a first surface and a pair of facing surfaces connected to, and extending away from, the first surface that define a channel sized to receive the watthour meter blade.

14 Claims, 13 Drawing Sheets

(51) Int. Cl.
  *G01R 1/067* (2006.01)
  *G01R 31/00* (2006.01)
  *G01R 35/04* (2006.01)

(58) Field of Classification Search
  USPC ........ 324/500, 754.08, 74, 556, 133, 51, 66,
         324/508, 142, 435, 458, 723; 361/667,
         361/662, 807, 810, 641–658, 602, 622;
                                   29/428
  See application file for complete search history.

(56) References Cited

U.S. PATENT DOCUMENTS

| | | | |
|---|---|---|---|
| 6,059,605 | A | 5/2000 | Robinson et al. |
| 7,819,665 | B1 | 10/2010 | Nishizawa |
| 2002/0123265 | A1 | 9/2002 | Robinson et al. |
| 2009/0034168 | A1* | 2/2009 | Seff .......................... H02B 1/03 |
| | | | 361/660 |

* cited by examiner

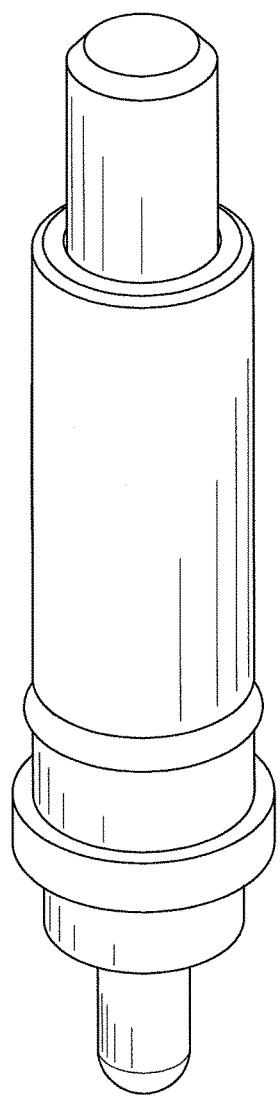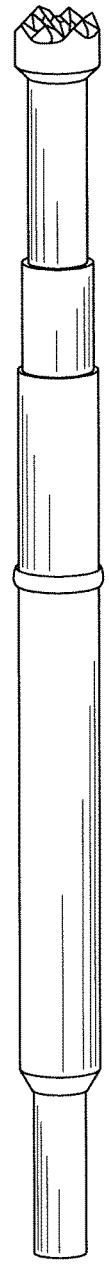
FIG. 3A                    FIG. 3B

UNIVERSAL WATTHOUR METER SOCKET/ADAPTER FOR FIELD TESTING

CROSS-REFERENCE TO RELATED APPLICATIONS

This application is the U.S. national phase of PCT/US2013/032267, filed Mar. 15, 2013. PCT/US2013/032267 claims the benefit under the Paris Convention of the Mar. 28, 2012 filing date of U.S. Ser. No. 61/616,781. U.S. Ser. No. 61/616,781 and PCT/US2013/032267 are incorporated herein in their entireties by this reference.

FIELD OF THE INVENTION

This invention relates to portable testing equipment for field testing of watthour meters.

BACKGROUND

The watthour meter test equipment sockets used today in most portable test equipment trace their heritage either from stationary test equipment or from portable meter socket adapters.

Stationary test equipment includes commercially available meter sockets of the general types available from Millbank, Durham, Siemens, General Electric, Eaton, Cooper and many others, as well as certain specially designed test meter sockets that have been used in such stationary test equipment as the Radian Research, Inc. RFL 5800 and UTEC 622, the Watthour Engineering Company, Inc. WECO 2300, and the Testcor Inc. MTS3000.

Commercially available meter sockets generally are not well adapted to the portable applications. Because of their application, socket weight, connector cycle life, and short cable routing are very low on the design criteria for these kinds of sockets. They were originally designed to protect a sealed meter in a stationary application with a limited number of insertions over its lifetime. They either come with a relatively heavy steel case or are intended to be mounted into a steel housing to protect them. Cycle life of the contacts is generally expected to under several hundred insertions and removals over the life of the socket. Typical meter socket connectors are illustrated in FIGS. 1a and 1b.

The high current carrying connectors of such sockets need low resistance contact to the current carrying blades of the meter. As a result, such connectors are usually designed to have an aggressive wiping action, and, if possible, to bite into the metal of the blade. This provides more certainty of sound electrical connection in the presence of potentially dirty meter connector blades. As a result of this feature, the connectors wear quickly and can create metal debris that stays in the meter socket housing.

A major exception to very limited connector lifetime is the lever bypass socket. These sockets have lever actuated current carrying connectors that provide nearly zero-force insertion of the meter. This is achieved by having the lever spread the contacts holding the current leads of the meter. The contact comprises a stationary jaw half supporting a movable jaw half which pivots on a pin through the movable jaw half and the stationary jaw half. When the lever is released, a spring closes the movable jaw half against the stationary jaw half, capturing the meter blade between them. This is illustrated in FIG. 2.

However, the lever bypass socket current connector provides no wiping action for the current carrying meter blade. The lever bypass socket current connector relies upon a large side pressure action against the meter blade to make low resistance contact to the meter blade. Thus, to make proper contact, the inserted meter blade must be relatively clean of oxide, and free of greases, residues and debris. The majority of the current flows through the stationary jaw half, since the movable jaw half is coupled to the stationary jaw half through the pivot pin which adds resistance to the current path through the movable jaw half to the conductor coupled to the stationary jaw half. The lever bypass connector is also difficult to clean.

The potential and other low current contacts such as KYZ contacts usually remain a scaled down version of the typical connector illustrated in FIG. 1. In some cases, a spring-loaded retractable button, FIG. 3a, or "pogo" pin, FIG. 3b, is used to contact to the end of the contact blade.

The lifetime of the lever bypass socket is generally longer than the typical meter socket, because the lever bypass socket was designed with the idea that the meter might be removed for testing more frequently, for example, on a monthly basis. However, the lever bypass socket was not designed for the test equipment market, where dozens of meters a day can be inserted into the socket for testing. Replacement of contacts in these sockets usually requires significant effort, as the sockets were not designed with field replacement of the components in mind.

Test meter sockets such as those incorporated into the above-identified equipment were designed specifically for use in stationary test equipment. As a result, those sockets have been designed to take the abuse of repeated insertions and removals. They use zero insertion force current blade connectors similar to those found in lever bypass meters, but generally have much higher clamping forces to the meter blade than are found in the lever bypass socket. Instead of a lever to open the current connection and a spring to close the current connection, the current connection clamping is generally driven by a motor or solenoid with a greater force than found in the lever bypass socket. Also, the current connection clamping is frequently activated automatically or semi-automatically. The electrical potential connections are usually by means of a retractable button or pin similar to the button action described in the lever bypass socket described above with the connection made to the end of potential connection blade.

These meter sockets have improved the lifetime of commercial sockets. However, because they are designed for tens of thousands of meter insertions and removals over their useful lifetimes, they have higher connection pressures in their current connections, and have a motor or solenoid, these meter sockets are even heavier than their commercially available counterparts. These designs have improved socket lifetime in exchange for increased complexity and weight. Additionally, as these meter sockets were intended for stationary application where size, weight and complexity are not major issues, they have not addressed minimizing routing of current-carrying wire to reduce wire weight and volt-ampere (hereinafter sometimes VA) drive required to test a meter.

Currently available portable meter socket adapters are somewhat better adapted to the portable test equipment market, since the designers focus on weight as a primary consideration. Ekstrom and Marwell are two manufacturers of currently available portable meter socket adapters. Originally these adapters aided field testing of meters with load boxes and reference standards by adapting meter blades and meter sockets to standard connection points for the test equipment. Depending upon what meter configurations were being tested during the day, the field tester might have to carry several different meter socket adapters. Weight was consequently an issue.

These socket adapters typically contain both meter socket connectors on the front side, FIGS. 4a and 4b, and meter blades on the back side, FIG. 4b.

The connectors are similar in form to the connectors illustrated in FIG. 1, but are typically made using sturdier materials and methods to improve useful life.

The current trend is away from carrying several pieces of gear and combining load box, reference standard and adapter socket into one piece of portable test gear that can service many, and preferably all, of the S-base meter forms. System weight, service life, ease of maintenance, and robustness in a rugged operating environment are of primary importance.

The Powermetrix PowerMaster 4 series automated meter tester is an example of equipment using meter sockets adapted from stationary equipment. Examples of equipment using adaptations of these meter socket adapters for the meter socket in the test equipment are the Radian RM-17 portable watt hour test system and the Probewell MT-1 Series of portable watthour meter testers.

The disclosures of all of these prior art meters are hereby incorporated herein by reference. This listing is not intended as a representation that a complete search of all relevant prior art has been conducted, or that no better references than those listed exist. Nor should any such representation be inferred.

SUMMARY

A portable device for field testing watthour meters includes a socket. The socket includes potential and low current connectors, each comprising a wire bail so oriented that the connector can connect to watthour meter blades oriented in either of two orientations 90° apart from each other by resiliently deflecting a portion of the bail.

Illustratively, each low current connector comprises a pair of wire bails so oriented that the connectors can connect to watthour meter blades oriented in either of two orientations 90° apart from each other by resiliently deflecting a portion of each bail of the pair.

Illustratively, the wire bail or wire bails is or are oriented at about a 45° angle to each of the two orientations 90° apart from each other.

Illustratively, the connector makes contact with two opposite sides of a respective watthour meter blade when the watthour meter blade is inserted into the connector.

Illustratively according to this aspect, the connector comprises stainless steel plated first with nickel then with silver.

Alternatively illustratively, the connector comprises a memory metal to promote recovery of the connector following removal of a respective watthour meter blade from the connector.

Further illustratively, the device comprises a printed circuit board (PCB). The PCB includes a slot for receiving each connector to relieve stress on the electrical connection of the connector to the device.

A portable device for field testing watthour meters includes a socket and high current terminals. Each high current terminal comprises a jaw socket cup. A torsion clip is provided in the jaw socket cup for contacting a meter blade when meter blade is inserted into the jaw socket cup. Each torsion clip includes a pair of facing surfaces. Torsion louvers project from each facing surface toward the other facing surface. The meter blade contacts and flexes the torsion louvers by said contact to promote a low electrical resistance, highly mechanically robust connection between the torsion louvers and the meter blade.

Illustratively, the torsion clip is removable from the jaw socket cup to facilitate cleaning of the jaw socket cup, or replacement of the torsion clip if the torsion clip becomes damaged or worn.

Illustratively, the torsion clip includes a retaining barb to prevent the torsion clip from being pulled out of the jaw socket cup when the meter blade is removed.

Illustratively, the torsion louvers projecting from each facing surface are arranged in rows. The torsion louvers of each row contact the meter blade in sequence as the meter blade is inserted into the torsion clip, and break contact with the meter blade in sequence as the meter blade is withdrawn from the torsion clip.

Illustratively, each torsion louver includes a shear edge adapted to penetrate foreign matter on the meter blade to reduce electrical resistance between the shear edge and the meter blade.

Illustratively, each torsion clip accommodates misalignment of its respective meter blade within established tolerance limits to reduce blade stress on the meter under test.

A portable device for field testing watthour meters includes a socket and high current terminals. Each high current terminal comprises a jaw socket cup mounted to the meter socket housing with an integrated e-clip permitting the jaw socket cup to rotate a small amount to accommodate meter blade locations within meter blade tolerance limits.

Illustratively, the device includes an internally threaded shaft for attaching a ring terminal of a current conductor by a bolt, thereby providing a low resistance contact between the jaw socket cup and the current conductor.

A portable device for field testing watthour meters includes a socket, high current terminals and a socket housing from which the terminals extend. The housing is constructed in part from molded filled or unfilled resins. A first resin surrounding the terminals is a relatively higher temperature resin. A second resin forming parts of the housing not surrounding the terminals is a relatively lower temperature resin.

Illustratively, the first resin comprises polyetherimide.

A portable device for field testing watthour meters includes a socket, high current terminals, a socket housing from which the terminals extend, current amplifiers, and current output transformers coupled to the current amplifier. The current output transformers are located adjacent the high current terminals to minimize resistive losses from delivering current to the meters during testing, resulting in reduced weight compared to prior art devices for field testing watthour meters.

A portable device for field testing watthour meters includes a socket, high current terminals, a socket housing from which the terminals extend, an integral reference standard, and current sense transformers coupled to the integral reference standard. The current sense transformers are located within the meter socket. The current flowing in the high current terminals flows in the current sense transformers in the meter socket but not to the reference standard.

A portable device for field testing watthour meters includes a socket. The socket includes a housing and high current terminals, each comprising a jaw socket cup. An o-ring is provided on each jaw socket cup to provide a seal between its respective jaw socket cup and the housing.

Of course, any one of these above recited features may be used in a portable device for field testing watthour meters with any one or more others of these above recited features.

BRIEF DESCRIPTION OF THE DRAWINGS

The invention may best be understood by referring to the following detailed description and accompanying drawings. In the drawings:

FIGS. 3a-b illustrate a prior art spring-loaded retractable button or pogo pin;

DETAILED DESCRIPTIONS OF ILLUSTRATIVE EMBODIMENTS

Figure 5:
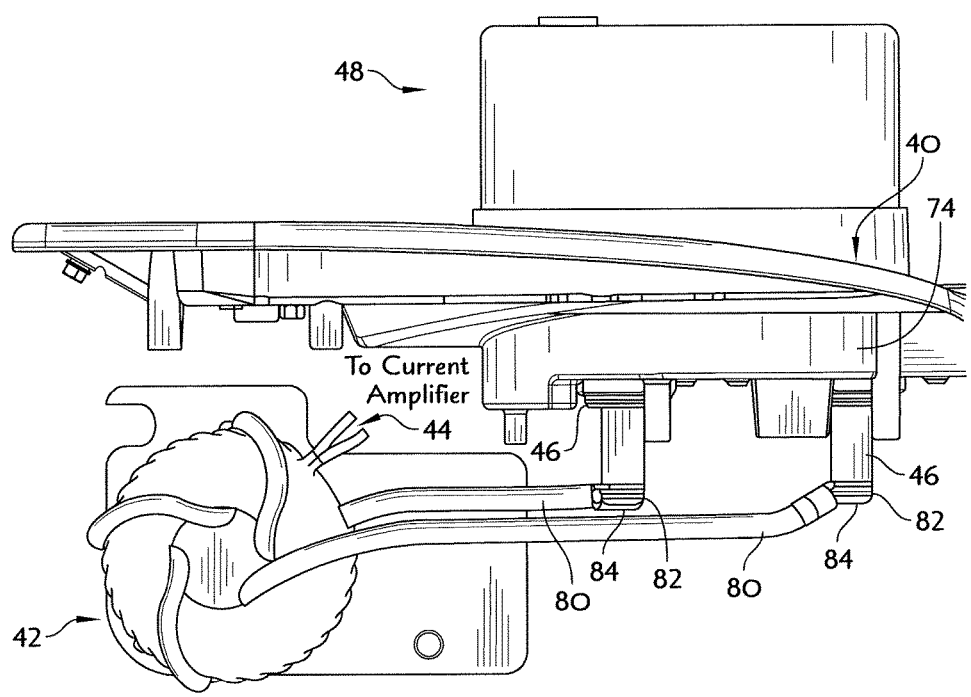
FIG. 5 illustrates a partial longitudinal sectional side elevational view of the meter socket of the present invention with a meter to be tested in place in the socket.

Referring particularly to FIG. 5, a universal meter socket 40 for portable test equipment has low insertion and extraction forces that is both durable and light weight with a long service life. The universal meter socket 40 provides field cleanable terminals with replaceable wear components. The socket 40 also provides short current paths for the high current sections of the meter, further reducing equipment weight by reducing wire weight and voltage-current (hereinafter sometimes VA) drive requirements for test equipment.

The socket 40 form permits high current-carrying paths to be short. An improved current connector provides low insertion force and low resistance. An improved voltage connector incorporates low mass, no moving parts and Kelvin-style connection to the meter blades.

The socket 40 design permits minimal path lengths for the wires that carry large currents. Conducting high currents over long distances adds weight to the system owing to the weight of the wire itself. The less wire that is needed to conduct, for example, 50 amperes, the less the socket 40 will weigh. The socket 40 has been designed to permit the placement of the current output transformers 42 of the current amplifier 44 adjacent the high current terminals 46 of the socket 40 itself. The amplifier 44 can be placed in a more convenient location. This results in minimal resistive ($I^2R$) losses from delivering the high current to the meter 48 under test, and a lower VA requirement for the current amplifier 44. This translates into lower weight for both the current amplifier 44 and the system power supply of the test equipment.

As illustrated in FIG. 5, the current output transformer 42 is located near the jaw sockets 52 of the meter 48 with the leads from the transformer 42 to the jaw sockets 52 being between about 3.5 inches (about 8.9 cm) and about 6 inches (about 15.2 cm) long. For simplicity, FIG. 5 shows the high current output of the transformer 42 as a single winding. A typical implementation uses multiple high current windings that can be placed in parallel or series by relays on the transformer 42 mounting board to permit optimization of the current output transformer 42's weight.

Figure 6:
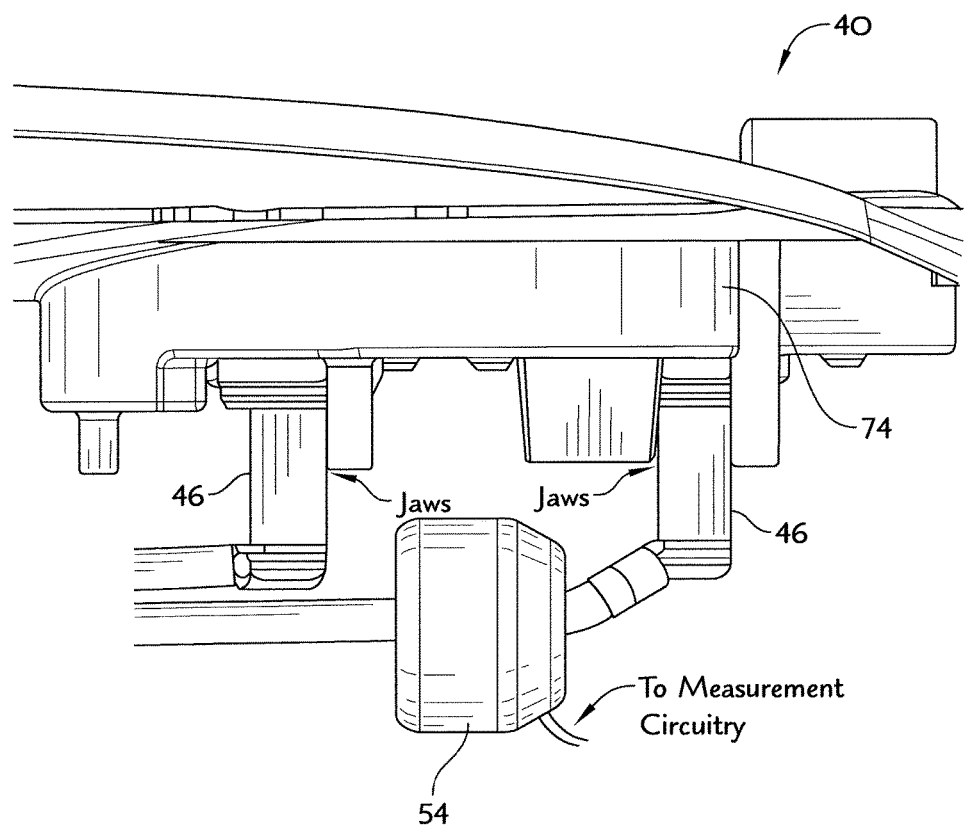
FIG. 6 illustrates a partial longitudinal sectional side elevational view of the meter socket of the present invention with a meter to be tested in place in the socket.

Referring to FIG. 6, the socket 40 is also designed to permit the current sense transformers 54 from the integral reference standard to be placed directly in the socket 40 instead of in the reference standard. With the current sense transformers 54 placed within the meter socket 40, the high current being measured no longer needs to be routed to and from the measurement reference standard. This further reduces wire weight and the $I^2R$ losses in the system, permitting further system weight reduction.

Figure 7:
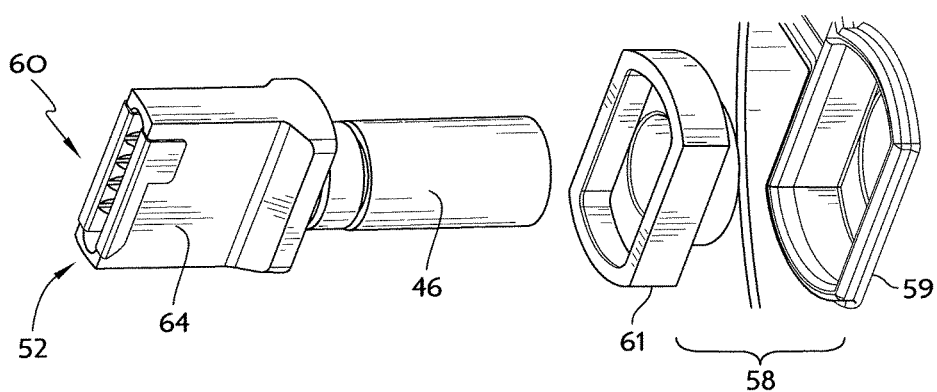
FIG. 7 illustrates an exploded perspective view of a detail of the meter socket of the present invention.

With reference to FIG. 7, even with the high current terminals 46s' resistance optimized, the high current terminals 46 reach temperatures that can weaken readily molded, light weight plastics. To deal with this, the socket 40 implements a thermal break 58 around the high current terminals 46 to permit the bulk 59 of the plastic used in the socket 40 to be chosen for weight, strength, and molding characteristics, with high temperature plastics 61 being used only inside the thermal break 58. The thermal break 58 reduces the temperatures seen by the rest of the socket 40's plastic 59 by isolating the hot high current terminals 46 from that plastic 59 by the thermal break 58. It can be seen that the jaw socket 52 on the left rests inside the thermal break 58 in the center, which in turn rests inside a holding feature in the socket 40's molded plastic 59. The high temperature plastic 61 used in the illustrated embodiment is Saudi Basic Industries Corporation (SABIC) Ultem® polyetherimide.

Figure 1A:
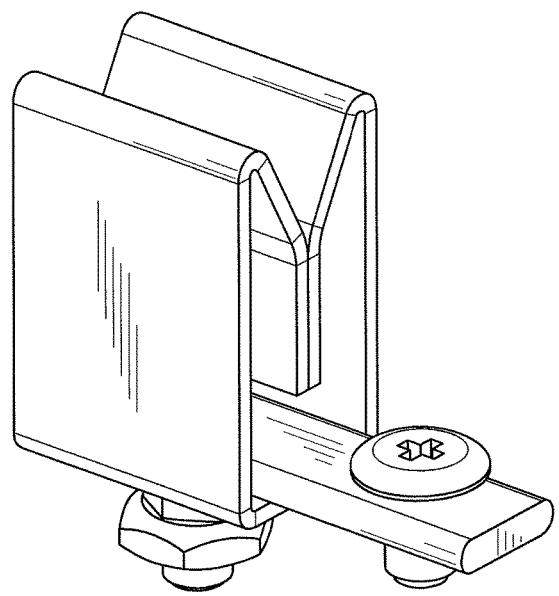
FIGS. 1a-b illustrate certain prior art meter socket connectors.
Figure 1B:
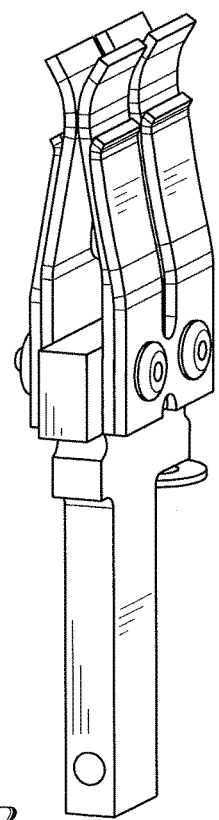
Figure 2:
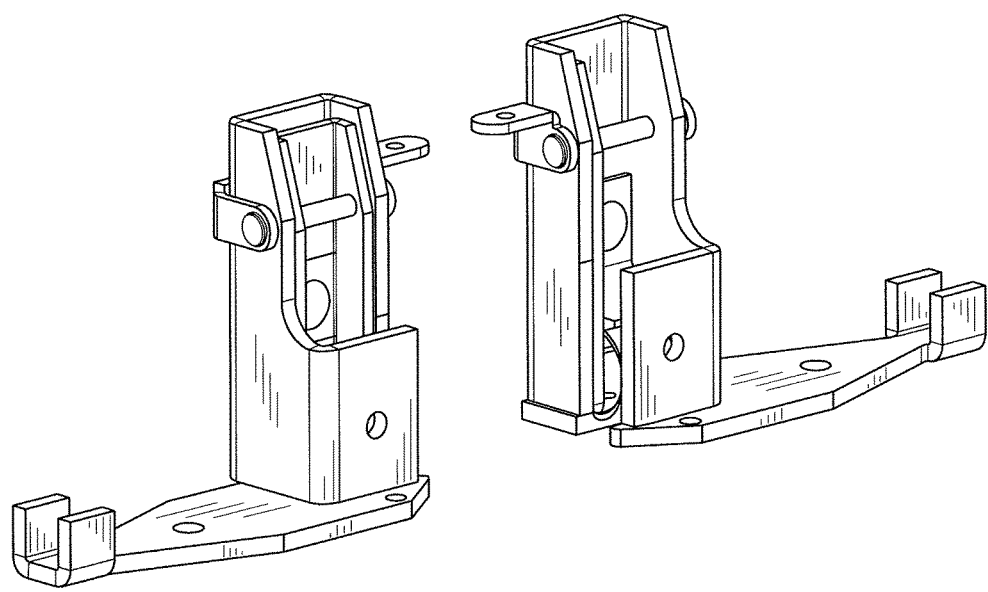
FIG. 2 illustrates a prior art lever bypass socket.
Figure 4A:
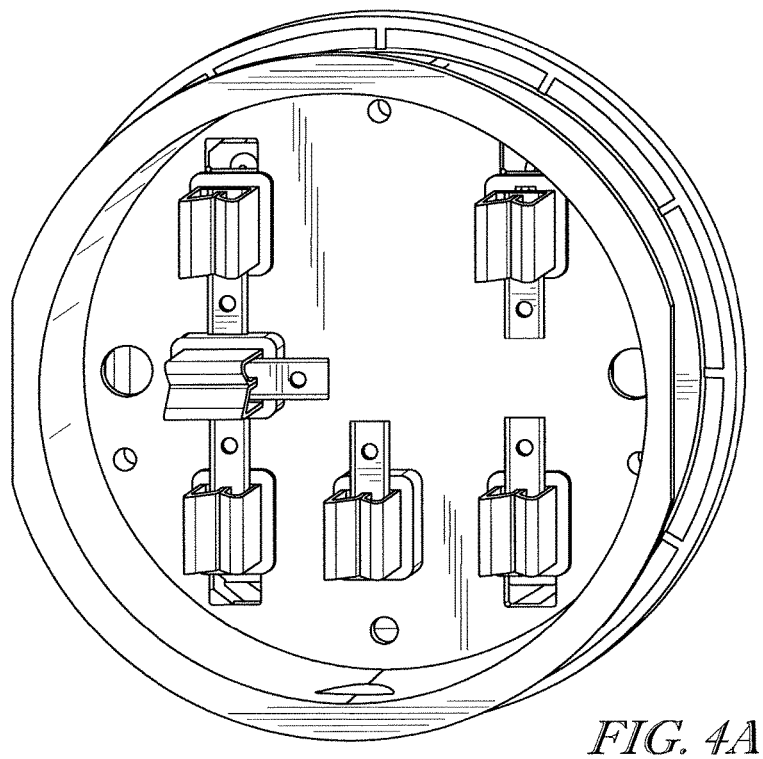
FIGS. 4a-b illustrate a prior art socket adapter that contains meter blades on the back side and meter socket connectors on the front side.
Figure 4B:
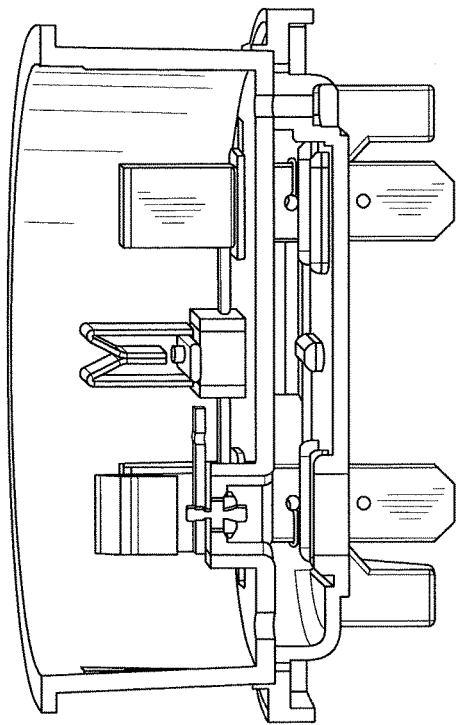

Referring now particularly to FIGS. 8-12, the current connector 46 comprises a torsion clip 60 which makes connection to the current carrying meter blades 62 and a jaw socket cup 64 that holds the torsion clip 60. The jaw socket cup 64 carries the current and provides the mechanical mount to the socket 40 molding. Where previous current connectors provided for only one or two points of contact with the meter blade 62 and a relatively long current path down a long, thin metal strip, as illustrated in FIG. 1, the torsion clip 60 provides a multiple contact, low resistance, low insertion- and extraction-force connection between the meter current carrying blade 62 and the jaw socket cup 64.

The torsion clip 60 is readily removed from the jaw socket cup 64 for cleaning of the connector 46 assembly or for field replacement of the torsion clip 60 if the torsion clip 60 becomes damaged or worn. If grease, metal flakes, tabs, wires and other foreign material get introduced into the contact system, the torsion clip 60 can be pulled straight out with any tools to assist in the repair.

The torsion clip 60 has multiple louvers 68 on each side. In the present implementation, there are twenty-six independent torsion louvers 68, thirteen in three rows (4-5-4) on each sidewall of the clip 60. Each torsion louver 68 is capable of making independent contact to the meter blade 62. Other designs with more and fewer torsion louvers 68 are, of course, possible. As can best be seen in FIG. 9, the current path including the meter blade 62 is also kept short.

Between the multiple contacts and short distance the current must travel, the resistance of the connection is kept very low.

The insertion and extraction force is kept low because the design of the torsion clip louvers 68 is such that different louvers 68 and rows of louvers add load at different times during the insertion of the blade 62. Dividing up the contact sequence provides lower instantaneous pressure.

Figure 10:
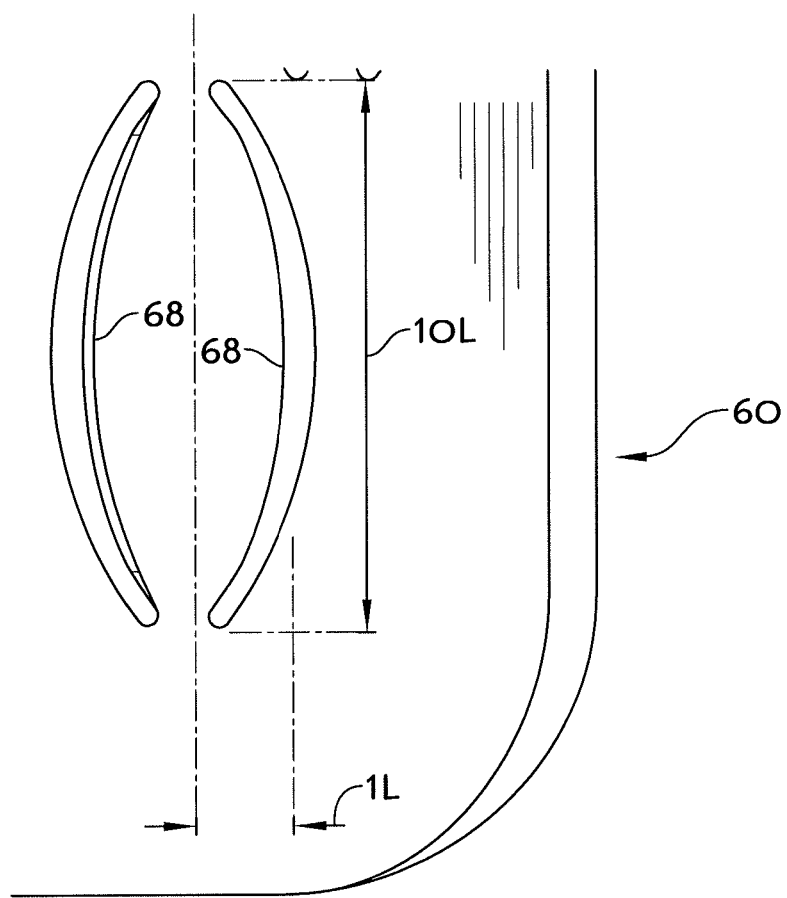
FIG. 10 illustrates a further enlarged elevational view of the detail illustrated in FIGS. 8-9.

In addition to being replaceable, the illustrated torsion clips 60 are designed for 20,000+ insertion cycles. The illustrated torsion clip 60 material is spring tempered C18080 copper. This alloy provides fatigue resistance and relatively lower electrical resistance compared to certain other copper alloys. The louvers 68 are designed to permit the meter blade 62 to pass among the louvers 68 without snagging. This helps to reduce the potential for mechanical damage. As best illustrated in FIG. 10, metal fatigue of the louvers 68 was controlled in part by keeping the ratio of the louver 68 length to the deflection of the louver 68 at a ratio of greater than about 10:1. This reduces flex of the louvers 68, reducing fatigue.

The louvers 68 on the torsion clip 60 are designed to cut through oxides and other nonconductive material on the meter blades 62. The individual rough shear edges 70 of the torsion louvers 68 are retained. These rough shear edges 70 promote corrosion cutting to minimize contact resistance. The tooling for stamping of the louvers 68 projects the shear edge 70 of the copper so that the shear edge 70 will "slice" through corrosion and lubricant on the blade 62 as much as possible.

Figure 8:
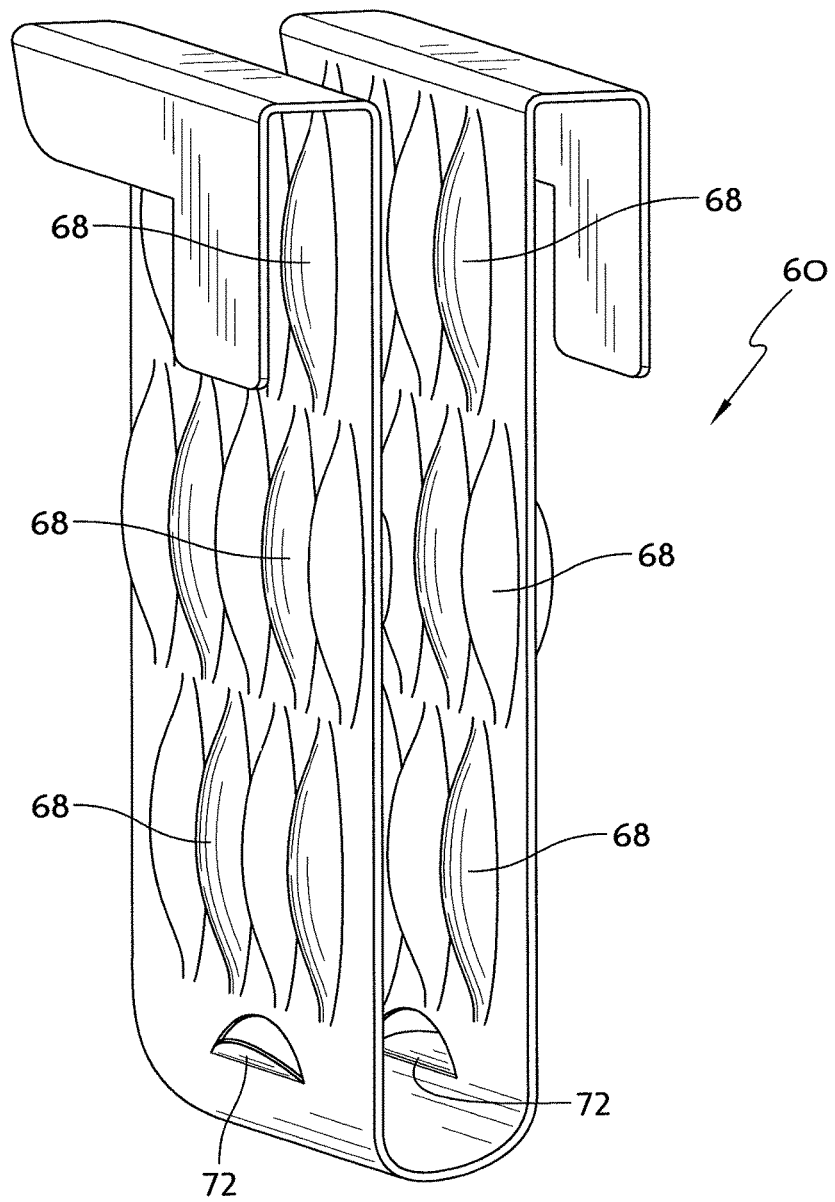
FIG. 8 illustrates a perspective view of a detail of the meter socket of the present invention.
Figure 9:
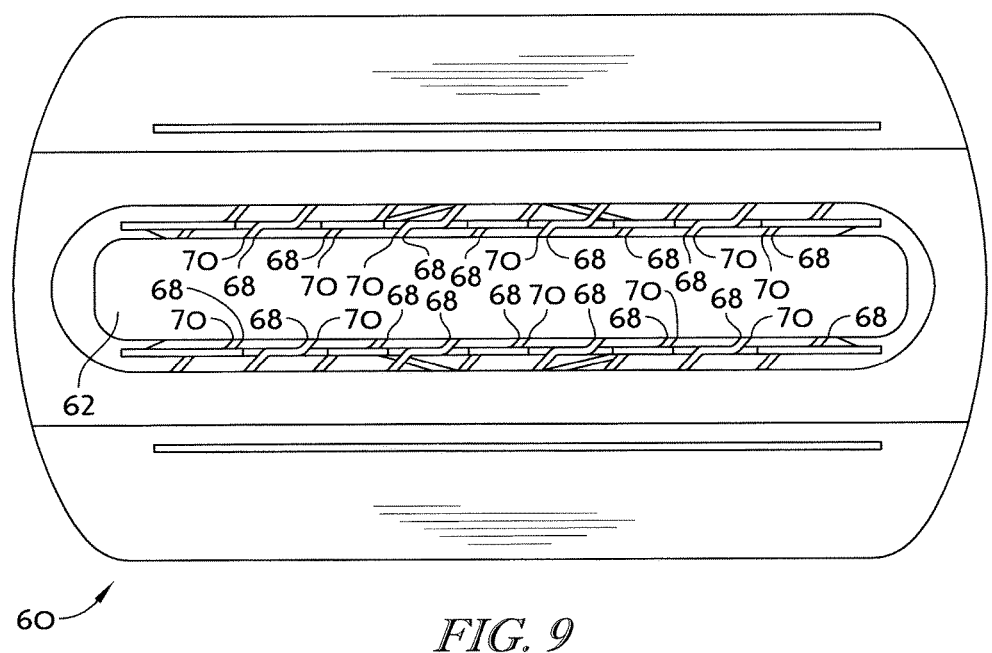
FIG. 9 illustrates a much enlarged top plan view of the detail illustrated in FIG. 8.

As can best be seen in FIG. 8, the torsion clip 60 has a retaining barb 72 at the bottom to help hold the clip 60 into place so that clip 60 is not pulled out when the meter blade 62 is removed.

Figure 11:
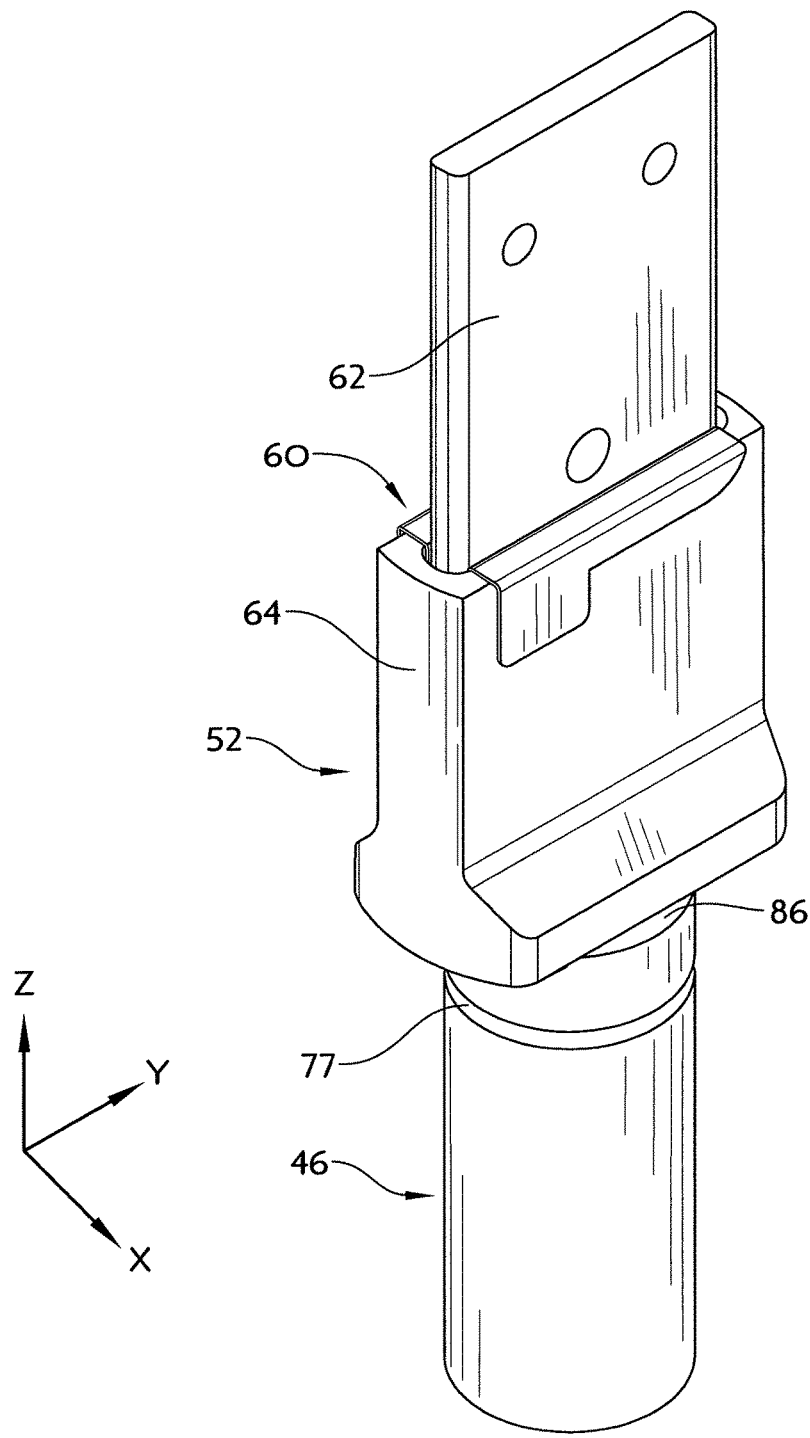
FIG. 11 illustrates a perspective view of a detail of the meter socket of the present invention, showing indices useful for understanding the invention.

Meter blades 62 are not typically perfectly perpendicular to the back of the meter 48, nor even necessarily parallel to each other. The illustrated torsion clip 60 design permits some tolerance for meter blades 62 to accommodate this. The design provides up to 6 degrees of freedom to compensate for a misalignment for the blades 62 within projected tolerance zones. With reference to FIG. 11 for definitions of X, Y and Z, the illustrated design provides misalignment tolerances of the blades 62 of X=0.025" (about 0.6 mm), Y=0.05" (about 1.3 mm), Z=0.5" (about 12.7 mm), $\theta_X$=2° from orthogonal to the YZ plane, $\theta_y$=3° from orthogonal to the ZX plane, and $\theta_Z$=2° from orthogonal to the XY plane. Blade 62 stress on the meter 48 and socket 40 is thus reduced. Blade 62-to-blade 62 stress could affect the accuracy of the measurement on meters 48 that use a Rogowski coil type of current measurement.

Figure 12:
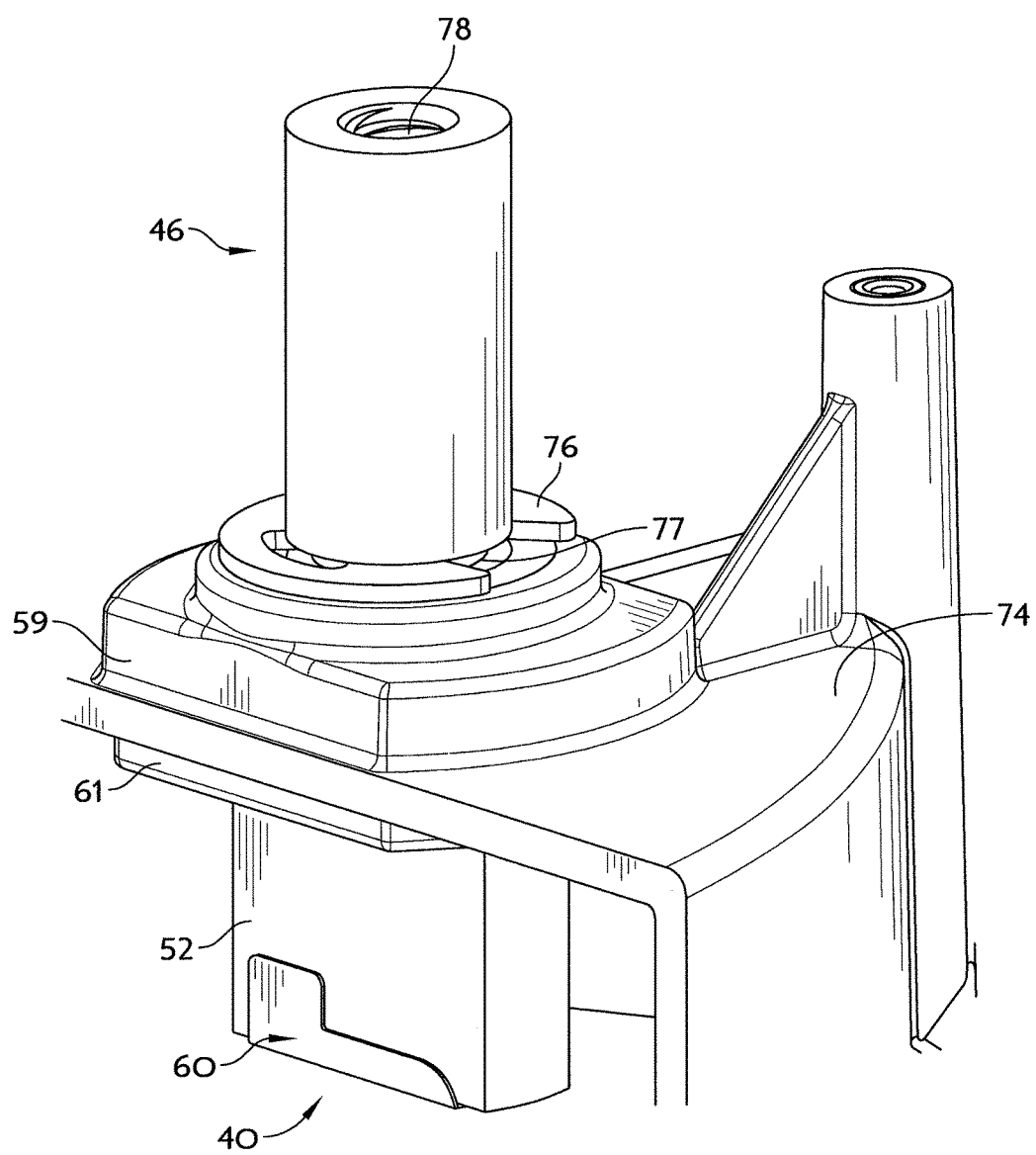
FIG. 12 illustrates a perspective view of the detail illustrated in FIG. 11 generally from the opposite direction; and, FIGS. 13a-c illustrate an elevational view of a detail of the meter socket of the present invention, FIG. 13a, and two plan views, FIGS. 13b and 13c, of the detail illustrated in FIG. 13a, engaging meter blades oriented at 90° to each other.

As best illustrated in FIG. 12, the jaw socket cup 64 is designed to be mounted to the meter socket housing 74 with an e-clip 76 in a groove 77 and has an internally threaded shaft 78 for attaching the current conductor 80, see FIG. 5, with a ring terminal 82 with a single bolt 84. This configuration provides a low resistance contact between the jaw socket cup and internal current conductor.

The e-clip 76 jaw socket 52 mounting permits the jaw socket cup 64 to rotate a small amount. This configuration permits the meter blades 62 to be nonparallel in the Z direction. Known prior art configurations do not provide for nonparallel orientation of the meter blades 62 in the Z direction.

The jaw socket cup 64 is designed to reduce fluid and dust migration into the electronics housing 74. When the jaw socket cup 64 is fitted with an o-ring 86, the o-ring 86-equipped jaw socket cup 64 substantially reduces the likelihood of fluid and dust entering the housing 74.

Figure 13A:
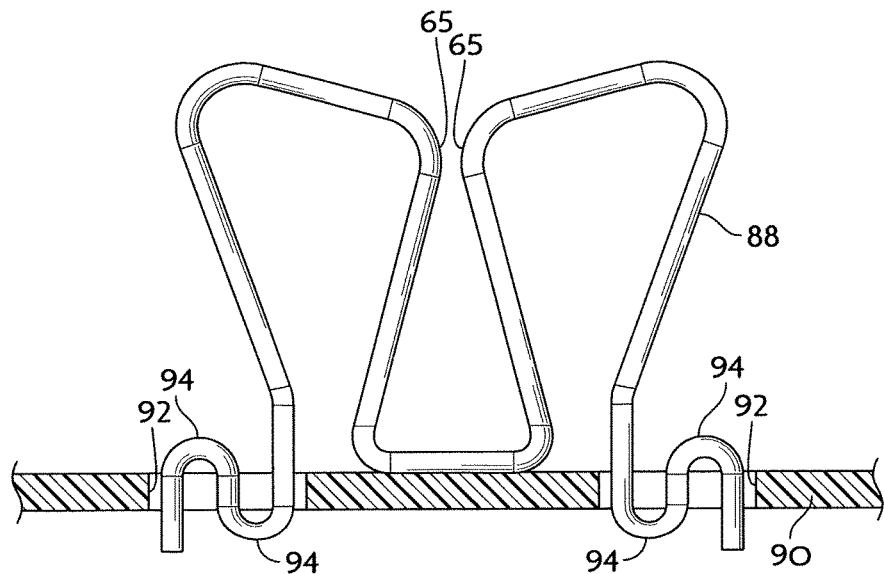
Figure 13B:
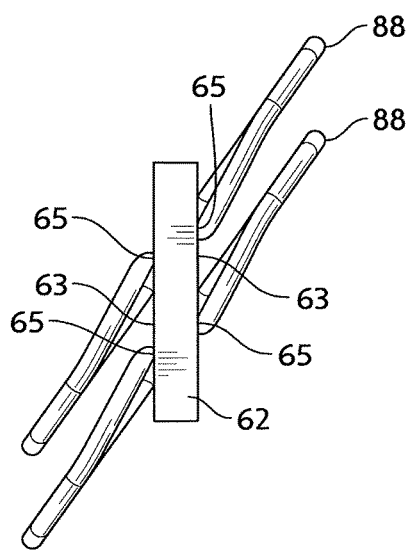
Figure 13C:
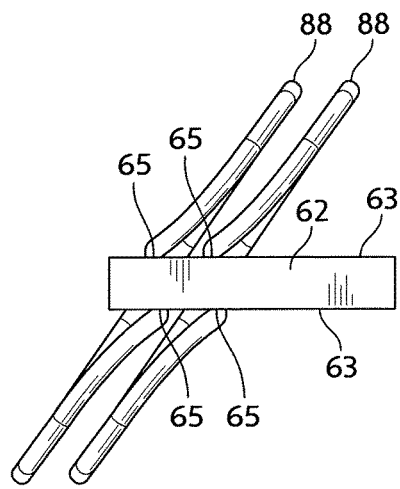

In experiments, an average insertion and removal force for the current-carrying connectors 46 was approximately 2.95 lb force over 17,720 cycles of the test. The average resistance of the current connection 46 was approximately 232 μΩ over the 17,720 cycles As illustrated in FIG. 13, the improved electrical potential and low current connectors 88 are designed to permit multiposition and multiangle meter contacts 62 in a small space and to provide for a Kelvin connection to these connectors 88. The connectors 88 are constructed from low profile wire forms, and the same design connectors 88 are used to connect blades 62 in the orientation illustrated in FIG. 13b or blades 62 in the orientation illustrated in FIG. 13c. The compact size of the connectors 88 permits connection to blades 62 oriented in either of the two orientations 90° apart and spaced very close together on the meter 48, a characteristic typical of many S-base meter forms.

The torsion design of the connector 88 moves the contact of the connector 88 to the sidewall 63 of the meter blade 62 instead of the end of blade 62. Better contact to the connector 88 is more easily established with the sidewall of the meter blade 62. The torsion design of the connector 88 also permits the connector 88 to make two connections 65 to the meter blade 62, one on each side of the blade 62. This improves the likelihood of a good connection to the blade 62, compared to the retractable button or pogo pin, FIGS. 3a-b, currently used in high cycle connection designs.

The current implementation of the connectors 88 uses a stainless steel plated first with nickel then with silver. "Memory" metals, such as Nitinol, which promote recovery of the wire form from significant deformation are also useful in this application.

As can also be seen in FIGS. 13a-c, the connector 88 is a torsion design with integrated printed circuit board (hereinafter sometimes PCB) 90 relief. When the meter blade 62 is inserted in the connector 88, the wire form twists and deflects to make secure contact with the meter blade 62. In order not to put strain directly on the solder joint during this twisting action, a non plated-through slot 92 is cut into the PCB 90 material where the wire form strain-relief bend 94 fits. This reduces the strain of the wire form flexing, preventing the flexing from being transmitted to the PCB 90 electrical connection to the connector 88 which is in a plated hole where it can be soldered.

By placing pairs of these wire form clip connectors 88 side by side on a PCB 90 as illustrated in FIGS. 13b and 13c, a high density Kelvin connection is made to the meter blade 62. Illustratively, any needed current flow may be provided by one wire form clip connector 88 of the pair and potential sensing may be provided by the other wire form clip connector 88 of the pair.

What is claimed is:
1. A portable device for field testing watthour meters including a socket, the socket including a connector configured to engage a watthour meter blade, the connector comprising a pair of wire forms so oriented that the connector can connect to a watthour meter blade oriented in either of two orientations 90° apart from each other by resiliently deflecting portions of the wire forms,
 wherein a first wire form of the pair of wire forms includes a first wire portion and a second wire portion that extend upwardly from a printed circuit board (PCB),
 wherein a second wire form of the pair of wire forms includes a third wire portion and a fourth wire portion that extend upwardly from the printed circuit board (PCB) parallel to the first wire portion and the second wire portion, wherein when the watthour meter blade is inserted into the connector in a first orientation of the two orientations, the first wire portion and the third wire portion are configured to deflect in a first direction to engage the watthour meter blade, and the second wire portion and the fourth wire portion are configured to deflect in a second direction opposite the first direction to engage the watthour meter blade, and wherein when the watthour meter blade is inserted into the connector in a second orientation of the two orientations, the first wire portion and the third wire portion are configured to deflect in the second direction to engage the watthour meter blade, and the second wire portion and the fourth wire portion are configured to deflect in the first direction to engage the watthour meter blade.

2. The device of claim 1 wherein the wire forms are oriented at about a 45° angle to each of the two orientations 90° apart from each other.

3. The device of claim 1 wherein:
the first wire portion and the second wire portion of the connector make contact with two opposite sides of a respective watthour meter blade when the watthour meter blade is inserted into the connector,
the third wire portion makes contact with the same side of the respective watthour meter blade as the first wire portion when the watthour meter blade is inserted into the connector, and
the fourth wire portion makes contact with the same side of the respective watthour meter blade as the second wire portion when the watthour meter blade is inserted into the connector.

4. The device of claim 1 wherein each of the first wire form and the second wire form of the connector comprises stainless steel plated first with nickel then with silver.

5. The device of claim 1 wherein each of the first wire form and the second wire form of the connector comprises a memory metal to promote recovery of the connector following removal of a respective watthour meter blade from the connector.

6. A portable device for field testing watthour meters including a socket comprising a jaw socket cup, a torsion clip in the jaw socket cup for contacting a watthour meter blade when the watthour meter blade is inserted into the jaw socket cup, the torsion clip including a first surface and a pair of facing surfaces connected to, and extending away from, the first surface, the first surface and the pair of facing surface defining a channel sized to receive the watthour meter blade,
wherein a first plurality of torsion louvers project from a first facing surface of the pair of facing surfaces toward a second facing surface of the pair of facing surfaces,
wherein a second plurality of torsion louvers project from the second facing surface toward the first facing surface, and
wherein the first and second plurality of torsion louvers are configured to contact the watthour meter blade and flex based on that contact.

7. The device of claim 6 wherein the torsion clip is removable from the jaw socket cup.

8. The device of claim 7 wherein the torsion clip includes a retaining barb to prevent the torsion clip from being pulled out of the jaw socket cup when the meter blade is removed.

9. The device of claim 6 wherein the torsion louvers projecting from the first and second facing surfaces are arranged in rows, the torsion louvers of each row being configured to contact the watthour meter blade in sequence as the watthour meter blade is inserted into the torsion clip, and break contact with the watthour meter blade in sequence as the watthour meter blade is withdrawn from the torsion clip.

10. The device of claim 6 wherein each torsion louver includes a shear edge adapted to penetrate foreign matter on the watthour meter blade to reduce electrical resistance between the shear edge and the watthour meter blade.

11. The device of claim 6 wherein the torsion clip accommodates misalignment of its respective watthour meter blade within established tolerance limits to reduce blade stress on the meter under test.

12. The device of claim 6 wherein:
each torsion louver of the first plurality of torsion louvers includes a body that extends from a base attached to the first facing surface to a tip positioned over an opening defined in the first facing surface, and
each torsion louver of the second plurality of torsion louvers includes a body that extends from a base attached to the second facing surface to a tip positioned over an opening defined in the second facing surface.

13. The device of claim 12 wherein the tip of each torsion louver of the first plurality of torsion louvers and the second plurality of torsion louvers includes a convex curved edge.

14. A portable device for field testing watthour meters, the portable device comprising a socket including:
a first connector including a first wire form and a second wire form that extends parallel to the first wire form, the first wire form and the second wire form being configured to resiliently deflect to receive a first watthour meter blade in one of a first orientation and a second orientation, the second orientation being 90° apart from the first orientation, and
a second connector including a jaw socket cup and a torsion clip coupled to the jaw socket cup, the torsion clip including a pair of facing surfaces that partially define a channel sized to receive a second watthour meter blade,
wherein the torsion clip includes a plurality of torsion louvers that extend into the channel, each torsion louver having a tip positioned in the channel over an opening defined in one of the pair of facing surfaces, each tip being configured to contact the watthour meter blade and flex based on that contact.

* * * * *